United States Patent
Zhang (10) Patent No.: US 7,003,756 B2
(45) Date of Patent: Feb. 21, 2006

(54) METHOD AND APPARATUS FOR CONTROLLING RIPPLING DURING OPTICAL PROXIMITY CORRECTION

(75) Inventor: Youping Zhang, Newark, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 10/810,250

(22) Filed: Mar. 26, 2004

(65) Prior Publication Data

US 2004/0181770 A1 Sep. 16, 2004

Related U.S. Application Data

(62) Division of application No. 10/016,837, filed on Dec. 12, 2001, now Pat. No. 6,763,514.

(51) Int. Cl.
G06F 17/50 (2006.01)
(52) U.S. Cl. .......................................... 716/19; 716/21
(58) Field of Classification Search .................. 716/19, 716/21
See application file for complete search history.

(56) References Cited

U.S. PATENT DOCUMENTS

| | | | | |
|---|---|---|---|---|
| 5,965,306 A | * | 10/1999 | Mansfield et al. | 430/22 |
| 6,467,076 B1 | * | 10/2002 | Cobb | 716/19 |
| 6,519,501 B1 | * | 2/2003 | Pierrat et al. | 700/121 |
| 6,567,972 B1 | * | 5/2003 | Tanaka et al. | 716/21 |
| 6,571,383 B1 | * | 5/2003 | Butt et al. | 716/19 |
| 6,574,784 B1 | * | 6/2003 | Lippincott et al. | 716/8 |
| 6,631,511 B1 | * | 10/2003 | Haffner et al. | 716/21 |
| 6,665,856 B1 | * | 12/2003 | Pierrat et al. | 716/19 |
| 6,709,793 B1 | * | 3/2004 | Brankner et al. | 430/5 |
| 6,768,958 B1 | * | 7/2004 | Ivanovic et al. | 702/94 |

* cited by examiner

Primary Examiner—Vuthe Siek
Assistant Examiner—Brandon Bowers
(74) Attorney, Agent, or Firm—Park,Vaughan & Fleming, LLP (57) ABSTRACT

One embodiment of the present invention provides a system that controls rippling caused by optical proximity correction during an optical lithography process for manufacturing an integrated circuit. During operation, the system selects an evaluation point for a given segment, wherein the given segment is located on an edge in the layout of the integrated circuit. The system also selects a supplemental evaluation point for the given segment. Next, the system computes a deviation from a target location for the given segment at the evaluation point. The system also computes a supplemental deviation at the supplemental evaluation point. Next, the system adjusts a bias for the given segment, if necessary, based upon the deviation at the evaluation point. The system also calculates a ripple for the given segment based upon the deviation at the evaluation point and the supplemental deviation at the supplemental evaluation point. If this ripple exceeds a threshold value, the system performs a ripple control operation.

24 Claims, 9 Drawing Sheets

METHOD AND APPARATUS FOR CONTROLLING RIPPLING DURING OPTICAL PROXIMITY CORRECTION

The subject matter of this application is a division under 37 C.F.R §1.53(b) of and claims priority under 35 U.S.C. §121 to a non-provisional application by the same inventor as the instant application entitled, "Method and Apparatus for Controlling Rippling During Optical Proximity Correction," having Ser. No. 10/016,837, and filing date 12 Dec. 2001, now U.S. Pat. No. 6,763,514. The claims in this divisional application were subject to a restriction requirement and are classified in class 716, subclass 21.

BACKGROUND

1. Field of the Invention

The invention relates to the process of designing and fabricating semiconductor chips. More specifically, the invention relates to a method and an apparatus for controlling rippling during an optical proximity correction (OPC) process, wherein the OPC process compensates for optical effects that arise during the semiconductor fabrication process.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is typically used to manufacture integrated circuits. This optical lithography process begins with the formation of a photoresist layer on the surface of a semiconductor wafer. A mask composed of opaque regions, which are formed of chrome, and light-transmissive clear regions, which are generally formed of quartz, is then positioned over this photo resist layer coated wafer. (Note that the term "mask" as used in this specification is meant to include the term "reticle.") Light is then shone on the mask from a visible light source, an ultraviolet light source, or more generally some other type of electromagnetic radiation together with suitably adapted masks and lithography equipment.

This light is reduced and focused through an optical system that contains a number of lenses, filters and mirrors. The light passes through the clear regions of the mask and exposes the underlying photoresist layer. At the same time, the light is blocked by opaque regions of the mask, leaving underlying portions of the photoresist layer unexposed.

The exposed photoresist layer is then developed, through chemical removal of either the exposed or non-exposed regions of the photoresist layer. The end result is a semiconductor wafer with a photoresist layer having a desired pattern. This pattern can then be used for etching underlying regions of the wafer.

Figure 1:
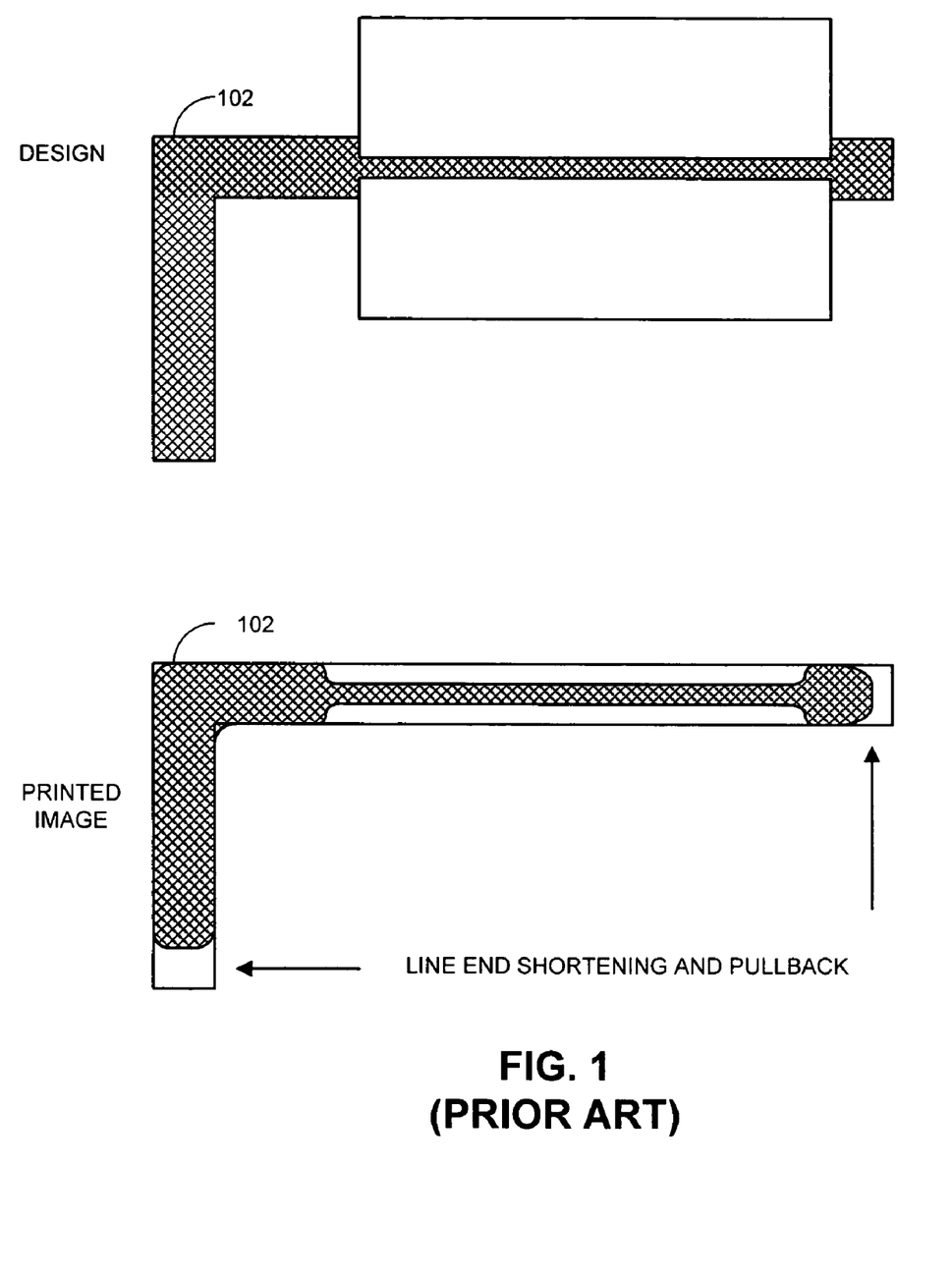
FIG. 1 illustrates the line end shortening problem.

One problem that arises during the optical lithography process is "line end shortening" and "pullback". For example, the upper portion of FIG. 1 illustrates a design of a transistor with a polysilicon line 102, running from left to right, that forms a gate region used to electrically couple an upper diffusion region with a lower diffusion region. The lower portion of FIG. 1 illustrates a printed image that results from the design. Note that polysilicon line 102 has been narrowed using optical phase shifting in order to improve the performance of the transistor by reducing the resistance through the gate region.

Also note that because of optical effects and resist pullback there is a significant amount of line end shortening. This line end shortening is due to optical effects that cause the light to expose more of the resist under a line end than under other portions of the line.

Figure 2:
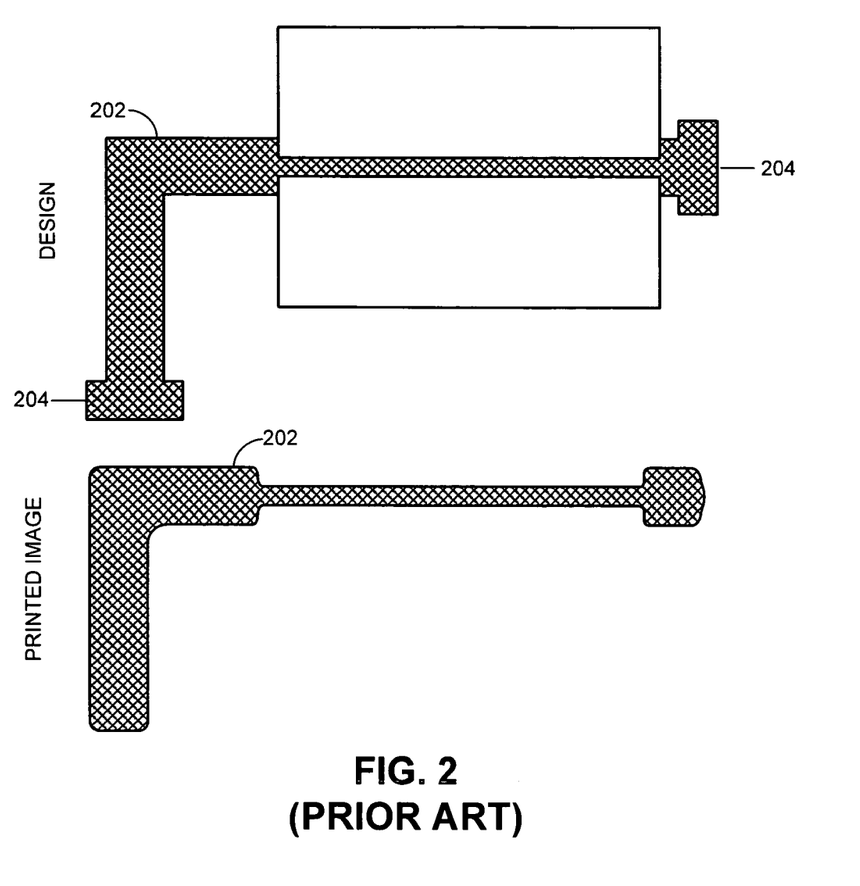
FIG. 2 illustrates the use of a hammerhead to compensate for the line end shortening problem.

In order to compensate for line end shortening, designers often add additional features, such as "hammer heads," onto line ends (see top portion of FIG. 2). The upper portion of FIG. 2 illustrates a transistor with a polysilicon line 202, running from left to right, which forms a gate region used to electrically couple an upper diffusion region with a lower diffusion region. A hammer head 204 is included on the end of polysilicon line 202 to compensate for the line end shortening. As is illustrated in the bottom portion of FIG. 2, these additional features can effectively compensate for line end shortening in some situations.

Figure 3:
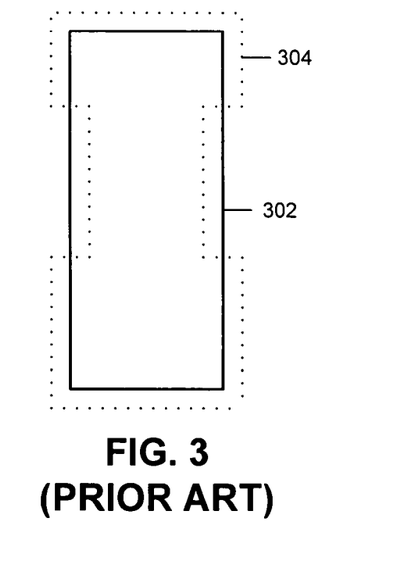
FIG. 3 illustrates a line end prior to and after optical proximity correction.

These additional features are typically added to a layout automatically during a process known as optical proximity correction (OPC). For example, FIG. 3 illustrates line end geometry 302 (solid line) prior to OPC and the resulting corrected line end geometry 304 after OPC (dashed line). Note that the corrected line end geometry 304 includes regions with a positive edge bias in which the size of the original geometry 302 is increased, as well as regions of negative edge bias in which the size of the original geometry 302 is decreased.

Figure 4:
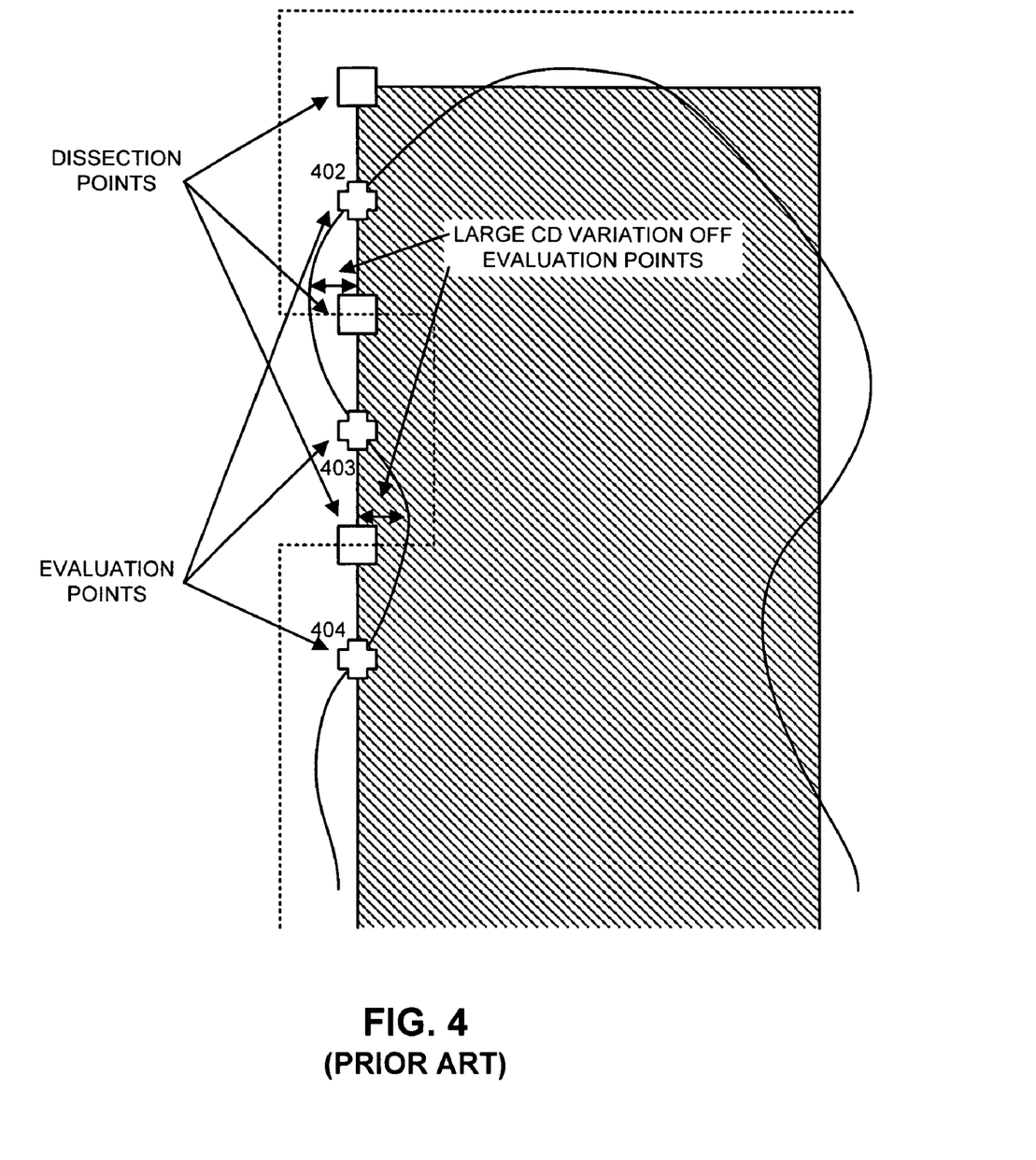
FIG. 4 illustrates the rippling problem.

During the OPC process, edges in the layout are divided into segments at dissection points. Next, the system selects an evaluation point for each segment and then produces a bias for each segment so that a simulated image of the segment matches the target image for the segment at the evaluation point. Referring to FIG. 4, biases are introduced for each segment to produce a layout represented by the dashed line. This layout produces a simulated image represented by the curved line. Note that this simulated image matches the target image at evaluation points 402–404. However, this simulated image has ripples which cause large critical dimension variations in between the evaluation points.

Circuit designers presently deal with rippling by manually adjusting dissection points, evaluation points and segment biases. This manual process is time-consuming and may not be applied consistently to all portions of the layout.

What is needed is a method and an apparatus that automatically controls rippling during the OPC process.

SUMMARY

One embodiment of the present invention provides a system that controls rippling caused by optical proximity correction during an optical lithography process for manufacturing an integrated circuit. During operation, the system selects an evaluation point for a given segment, wherein the given segment is located on an edge in the layout of the integrated circuit. The system also selects at least one supplemental evaluation point for the given segment. Next, the system computes a deviation from a target location for the given segment at the evaluation point. The system also computes a supplemental deviation at the supplemental evaluation point. Next, the system adjusts a bias for the given segment, if necessary, based upon the deviation at the evaluation point. The system also calculates a ripple for the given segment based upon the deviation at the evaluation point and the supplemental deviation at the supplemental evaluation point. If this ripple exceeds a threshold value, the system performs a ripple control operation.

In a variation on this embodiment, the system adjusts the bias, if necessary, and performs the ripple control operation, if necessary, for each segment that is part of the layout of the integrated circuit.

In a variation on this embodiment, prior to selecting the evaluation point for the given segment, the system dissects edges in the layout into segments for optical proximity correction purposes.

In a variation on this embodiment, performing the ripple control operation involves performing a refinement operation. This refinement operation involves: selecting additional dissection points for the edge that cause the given segment to be divided into multiple segments; selecting additional evaluation points for the multiple segments; and selecting additional supplemental evaluation points for the multiple segments. The refinement operation also involves adjusting the bias, if necessary, and performing the ripple control operation, if necessary, for each of the multiple segments.

In a variation on this embodiment, selecting additional evaluation points involves using supplemental evaluation points as the additional evaluation points.

In a variation on this embodiment, performing the ripple control operation involves performing a regeneration operation. This regeneration operation involves changing the location of dissection points for the edge to cause the edge to be divided into a different set of segments. It also involves adjusting the bias, if necessary, and performing the ripple control operation, if necessary, for each segment in the different set of segments. Note that changing the location of the dissection points for the edge can involve swapping dissection points and evaluation points.

In a variation on this embodiment, performing the ripple control operation involves controlling the bias for the given segment so that the ripple for the given segment does not exceed the threshold value, wherein as a consequence of controlling the bias a critical dimension for the given segment may not meet specification.

In a variation on this embodiment, computing the deviation for the given segment involves using a model-based technique for computing the deviation.

One embodiment of the present invention produces a system for controlling rippling caused by optical proximity correction during an optical lithography process used in manufacturing an integrated circuit. During operation, the system selects a first evaluation point and one or more additional evaluation points for a given segment, wherein the given segment is located on an edge in the layout of the integrated circuit. Next, the system computes a first deviation from a target location for the given segment at the first evaluation point. The system also computes a second deviation at the second evaluation point. Next, the system adjusts a bias for the given segment, if necessary, based upon multiple deviations at multiple evaluation points, including the first deviation at the first evaluation point and the second deviation at the second evaluation point.

In a variation on this embodiment, both the first evaluation point and the second evaluation point are located on the given segment.

In a variation on this embodiment, the additional evaluation points are located on the given segment or on neighboring segments.

In a variation on this embodiment, the system adjusts the bias, if necessary, for each segment that is part of the layout.

In a variation on this embodiment, the system uses a model-based technique for computing the first deviation and the second deviation.

DETAILED DESCRIPTION

Wafer Fabrication Process

Figure 5:
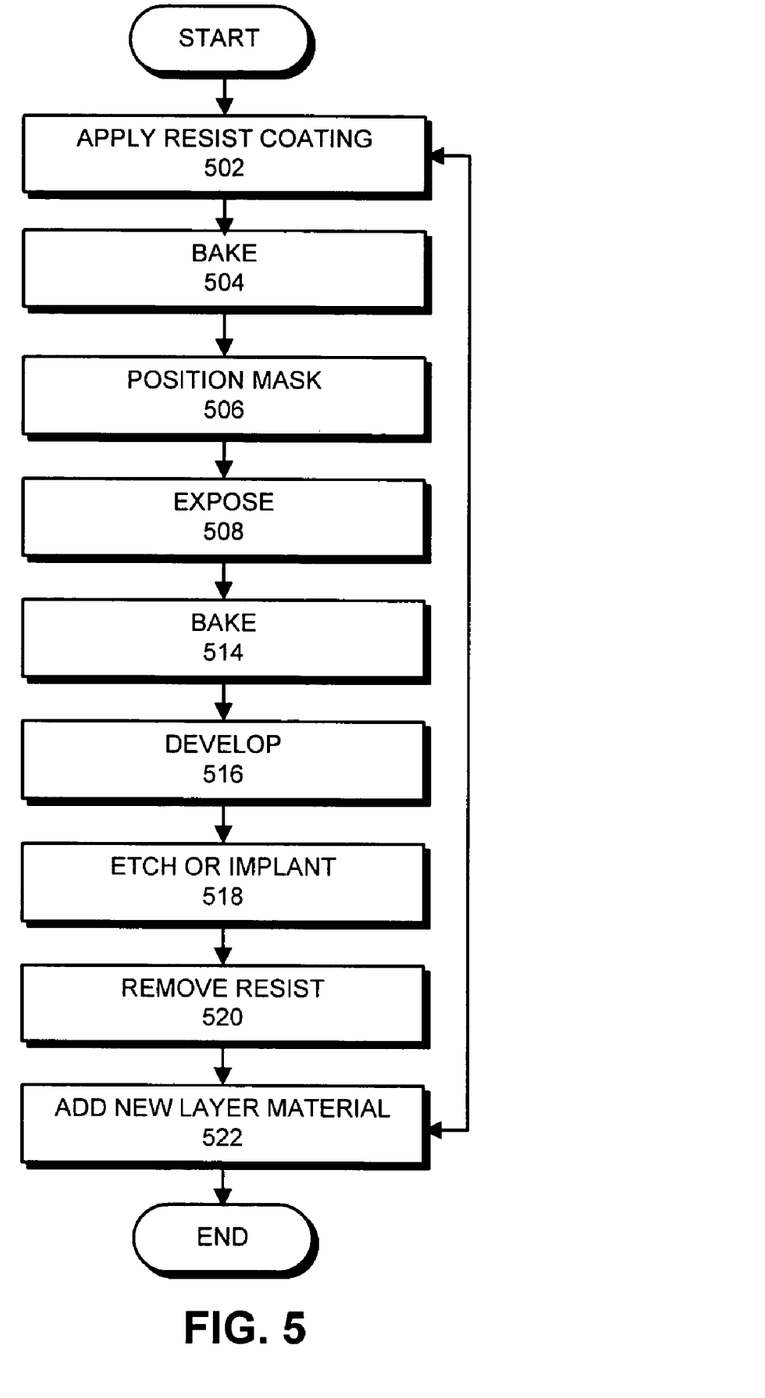
FIG. 5 is a flow chart illustrating the wafer fabrication process in accordance with an embodiment of the invention.

FIG. 5 is a flow chart illustrating the wafer fabrication process in accordance with an embodiment of the invention. The system starts by applying a photoresist layer to the top surface of a wafer (step 502). Next, the system bakes the photoresist layer (step 504). The system then positions a mask over the photoresist layer (step 506), and then exposes the photoresist layer through the mask (step 508). Next, the system optionally bakes the wafer again (step 514) before developing the photoresist layer (step 516). Next, either a chemical etching or ion implantation step takes place (step 518) before the photoresist layer is removed (step 520). (Note that in the case of a lift-off process, a deposition can take place.) Finally, a new layer of material can be added and the process can be repeated for the new layer (step 522).

Design Process

Figure 6:
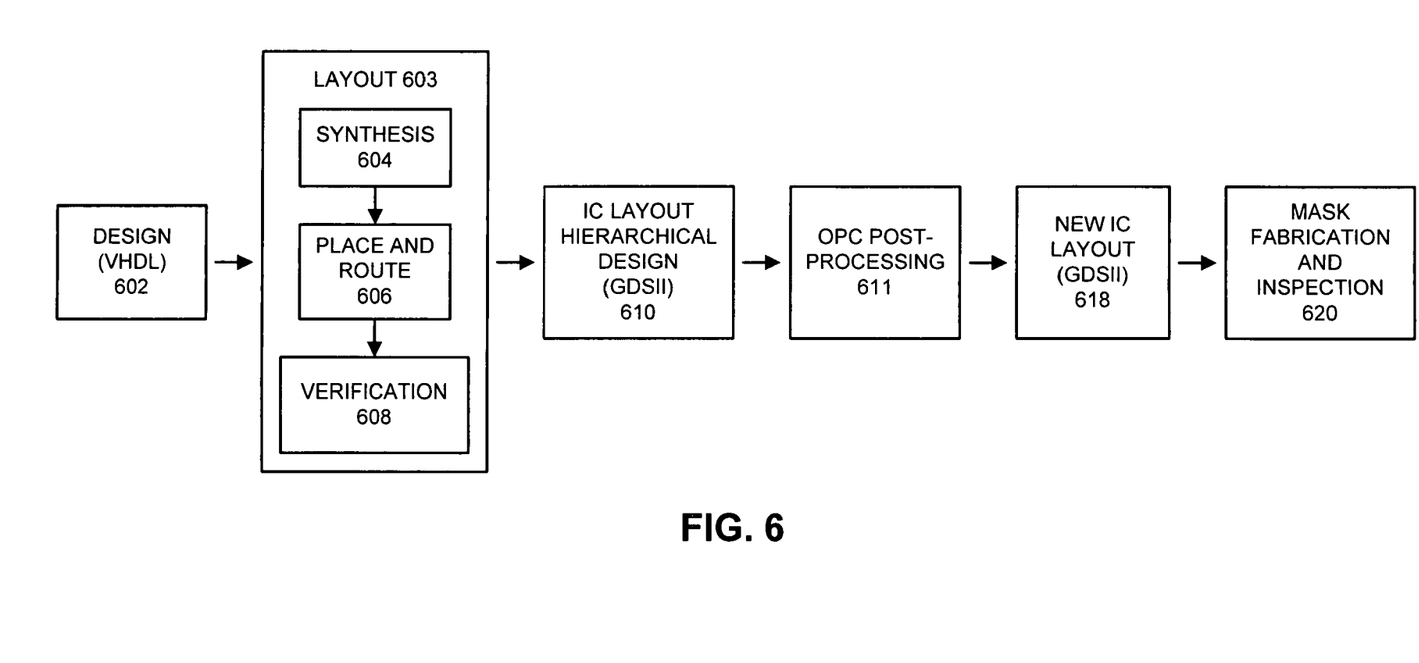
FIG. 6 illustrates the process of creating a mask to be used in fabricating an integrated circuit in accordance with an embodiment of the invention.

FIG. 6 illustrates the process of creating a mask to be used in the wafer fabrication process described above in accordance with an embodiment of the invention. The process starts when a circuit designer produces a design 602 in VHDL, or some other hardware description language. VHDL is an acronym for VHSIC Hardware Description Language. (VHSIC is a Department of Defense acronym that stands for very high-speed integrated circuits.) The VHDL standard has been codified in Institute for Electrical and Electronic Engineers (IEEE) standard 1076-1993.

Layout 602 then feeds through a layout system that performs a number of functions, such as synthesis 604, placement and routing 606 and verification 608. The result is an integrated circuit (IC) layout 610, which is in the form of a hierarchical specification expressed in a format such as GDSII.

IC layout 610 then passes into OPC post-processing system 611, which performs optical proximity corrections to compensate for optical effects that arise during the photolithography process.

The output of OPC post-processing system 611 is a new IC layout 618. New IC layout 618 subsequently passes into mask fabrication and inspection processes 620.

Optical Proximity Correction

Figure 7:
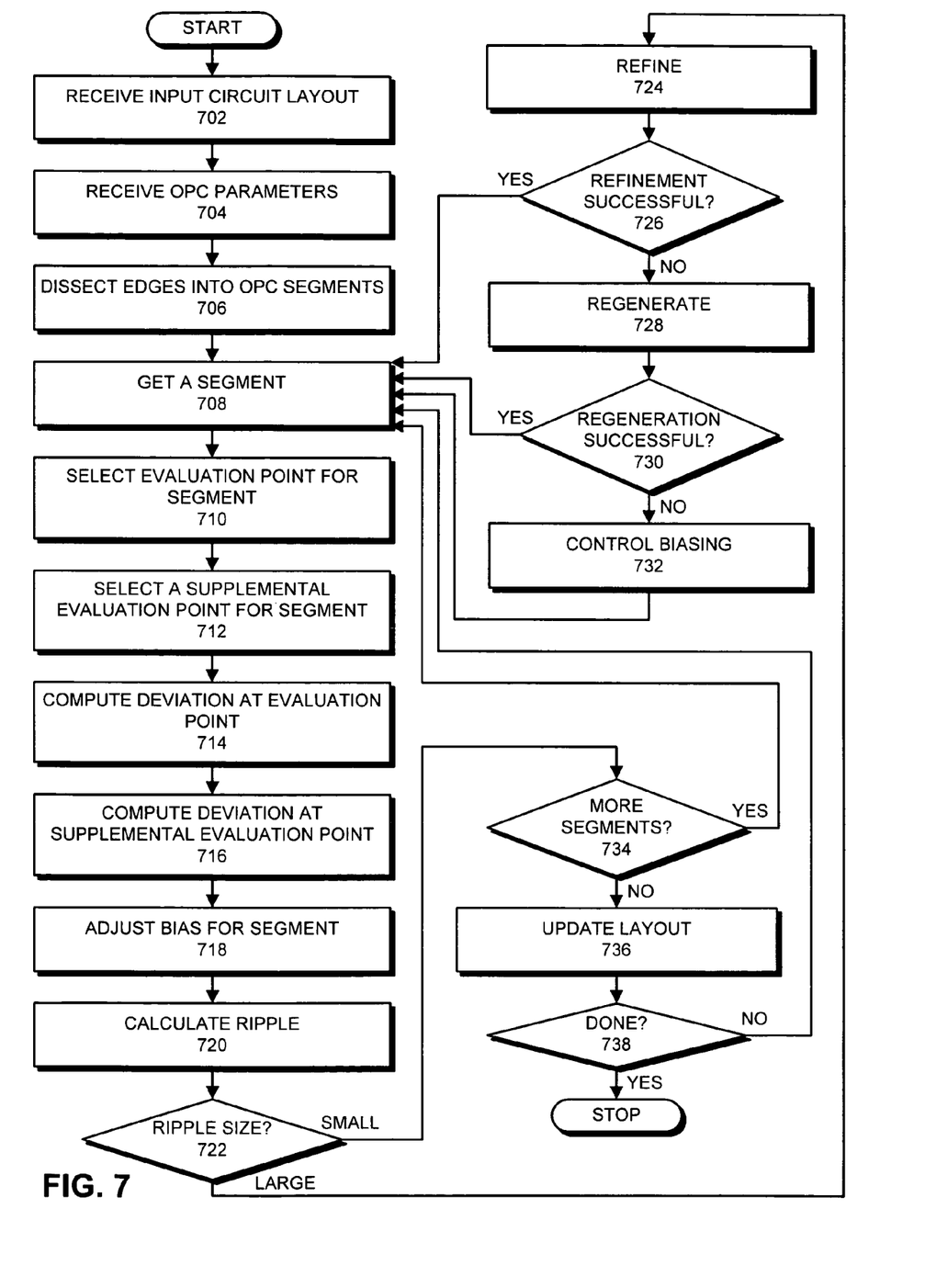
FIG. 7 is a flowchart illustrating the optical proximity correction process with rippling control in accordance with an embodiment of the invention.

FIG. 7 is a flowchart illustrating an optical proximity correction process which takes place in OPC post-processing system 611 of FIG. 6 in accordance with an embodiment of the invention. The process starts when the system receives a circuit layout requiring optical proximity correction (OPC) (step 702). This circuit layout can be received in a standard format, such as GDSII format, mask electronic beam exposure system (MEBES) format or some other format.

Next, the system receives OPC parameters for evaluating the input circuit layout (step 704). In one embodiment of the invention, the system receives OPC parameters from a user through a graphical user interface (GUI). In another embodiment, the OPC parameters are received in a data file, such as a text file or an XML file.

The system then dissects polygon edges in the circuit layout into OPC segments at dissection points (step 706). This is done in accordance with the OPC parameters. For example, the parameters might specify that segments are to be dissected every 120 nm, but that segments on inside corners are to be dissected every 60 nm.

The system then selects a given segment for evaluation (step 708). During this evaluation, the system then selects an evaluation point for the given segment (step 710).

The system also may select one or more supplemental evaluation points to be used in concert with the evaluation point to detect rippling (step 712). Note that supplemental evaluation points can be selected based on a set of user-specified rules. They are typically placed at locations at which the maximum amount of potential ripple can be measured. For example, they can be placed half way between evaluation points, or at dissection points where OPC encounters abrupt changes. They can also be placed based on results of a simulation.

The system next calculates a critical dimension (CD) deviation at the evaluation point for given segment (step 714). This can be done by using an optical model of the lithography process at the evaluation point. The system also calculates a supplemental deviation at the supplemental evaluation points (step 716). Note, although steps 710 through 718 are shown in sequence, they may be performed in parallel and/or out of order as appropriate. For example, the selection and computation of deviation for the supplemental evaluation points can occur on separate process threads from the computations for the evaluation point, as long as the ripple control operation is performed for the edge being considered before moving on to the next edge (before returning to step 708).

Next, the system adjusts a bias for the given segment (step 718). This bias adjustment is calculated based upon the deviation at the evaluation point. Alternatively, the bias adjustment can be calculated based upon a weighted function of the deviation at the evaluation point and the deviations at one or more additional evaluation points as is described below with reference to FIG. 9.

Next, the system calculates a "ripple" for the segment (step 720). The ripple is a value that measures the variation of CD values along the segment. In one embodiment of the invention, this ripple is computed by squaring the difference between the deviation at the evaluation point, $d_e$, and the deviation at each supplemental evaluation point, $d_{s(i)}$, and then averaging the squares to produce a positive ripple value, $$\sum_{i=1}^{N} \frac{(d_e - d_{s(i)})^2 w_i}{N},$$

where N is the number of supplemental evaluation points, and $w_i$'s are the constant weighting coefficients. In another embodiment, the ripple may simply be the maximum difference of deviations between any evaluation or supplemental evaluation points, i.e., $$\max\left\{\max_{i,j}|d_{s(i)} - d_{s(j)}|, \max_i|d_e - d_{s(i)}|\right\}.$$

The system then compares the ripple with a threshold value (step 722).

If the ripple is larger than the threshold value, the system performs a refinement operation that breaks the segment into multiple segments in order to more accurately control ripple (step 724). The threshold values are also user selected, and can be chosen to be shape dependent. For example, this threshold value can be selected based upon the edge specification and/or the critical dimension tolerance. One way to accomplish this is to select the threshold to be proportional to the critical dimension tolerance of the edge being processed. For example, if an edge has a tolerance of 5 nm (i.e., printed edge can be as far as 5 nm deviated from ideal), the maximum ripple should not exceed 3 nm (so that at the supplemental evaluation points the deviation is at most 8 nm). The refinement operation is described in more detail below with reference to FIG. 10. The system then determines if the refinement operation was successful (step 726). Note that the refinement operation may fail if the given segment is too small to be subdivided into multiple segments. If the refinement operation was successful (that is, new segments are created that replace the segments that have been refined), the system returns to step 708 to process the newly created segments as well as the remaining segments.

Otherwise, if the refinement at step 724 operation fails, the system performs a regeneration operation to change dissection points and/or evaluation points for the edge (step 728). This regeneration process is described in more detail below with reference to FIG. 11. The system then determines if the regeneration operation was successful (step 730). If so, new segments will have been created that replace the segments being regenerated, the system returns to step 708 to process the regenerated segments as well as the remaining segments.

If not, the system limits biasing of the segment in order to control the rippling (step 732). If the rippling exceeds a preset maximum threshold value, which can be determined for example based on a percentage, the system reduces the bias for the segment to stop the edge movement, even if the segment is not close enough to its target location to satisfy a design specification. The segment will hopefully be corrected to fall within specification in a subsequent iteration. If not, the user either has to accept this fact, or the user has to consider new dissection parameters to hopefully improve the situation. Note that the specification must sometimes be sacrificed in order to compromise with other factors, such as ripple, spacing constraints, and width constraints. Note that this bias limiting technique generally reduces aggressive edge movements during optical proximity correction. For segments that remain too far from meeting specification, a new dissection may need to be generated. Next, the system returns to step 708 to get the next segment.

If the ripple is smaller than the threshold value at step 722, the system determines if there are more segments to process (step 734). If not, the system proceeds to update the layout with the edge biases that have been calculated for each segment (step 736). Finally, the system determines if stopping criteria have been satisfied (step 738). If not, the system returns to step 708 for another iteration. Otherwise, the system terminates the process. The stopping criteria can include, reaching a preset maximum number of iterations, all segments reaching a maximum correction, exhaustion of allowed computational time, all segments being fully corrected, some segments are determined to be non-correctable or not further correctable for certain reason (e.g., low contrast), and/or combinations of one or more stopping criterion.

Note that the system may also decide to drop the evaluation of supplemental evaluation points and stop ripple control related operations (steps 712, 716, 720–732) for selected segments after the first few iterations, when it is determined that the segments are not subject to serious rippling effect. Doing so saves the computation time related to ripple computation and control of these segments.

Supplemental Evaluation Points

Figure 8:
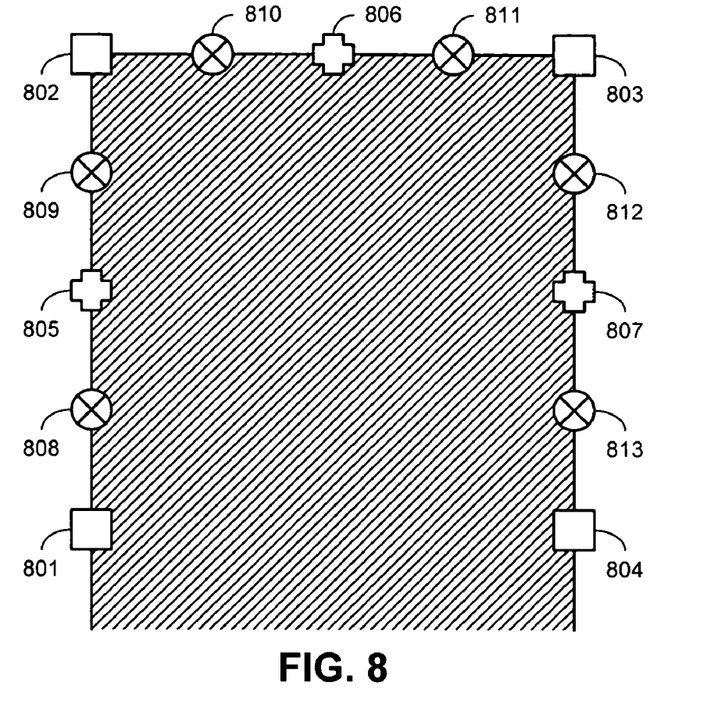
FIG. 8 illustrates a layout including supplemental evaluation points in accordance with an embodiment of the invention.

FIG. 8 illustrates a layout of a geometrical feature that includes supplemental evaluation points in accordance with an embodiment of the invention. This geometrical feature includes four dissection points 801–804, shown as squares, that define three segments running between the dissection points.

A first segment between dissection points 801 and 802 includes an evaluation point 805, shown as a plus sign. Evaluation point 805 is can be located on the first segment, but may in some cases reside on a neighboring segment and/or off the segment, e.g. displaced by a bias from the segment. Note that there may be more than one evaluation point for each segment. In addition to evaluation point 805, the first segment includes supplemental evaluation points 808 and 809, shown as circles with X's. Note that supplemental evaluation points 808 and 809 are generally located on the first segment or on adjacent segments. For example, they may coincide with the dissection point associated with the segment. In another embodiment, the points may simply be neighboring segments' evaluation points. Also note that there may be one or more supplemental evaluation points for each segment.

Similarly, a second segment between dissection points 802 and 803 includes an evaluation point 806. The second segment also includes supplemental evaluation points 810 and 811.

Finally, a third segment between dissection points 803 and 804 includes an evaluation point 807. The third segment also includes supplemental evaluation points 812 and 813.

Optimizations Based on Weighted CD Errors

Figure 9:
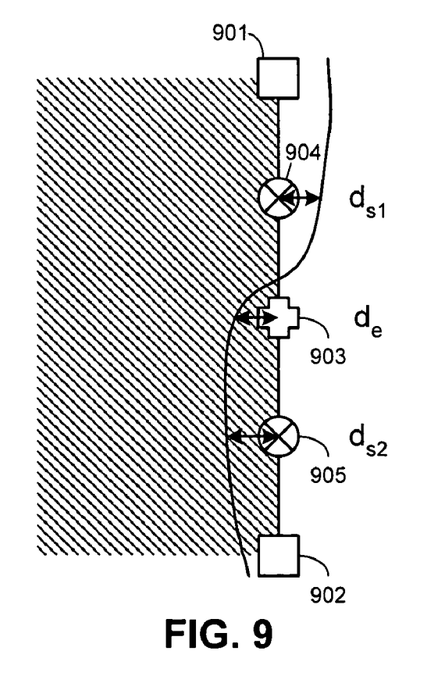
FIG. 9 illustrates an optimization based on weighted critical dimension errors in accordance with an embodiment of the invention.

FIG. 9 illustrates an optimization process based on weighted critical dimension errors in accordance with an embodiment of the invention. In this example, a segment defined by dissection points 901 and 902 includes evaluation point 903 and supplemental evaluation points 904 and 905. Evaluation point 903 has a deviation (also known as a "critical dimension error") $d_e$. Supplemental evaluation point 904 has a deviation $d_{s1}$ and supplemental evaluation point 905 has a deviation $d_{s2}$. During the bias adjustment process described with reference to step 718 of FIG. 7, the bias adjustment can be made to minimize $d_e^2$. Alternatively, the bias adjustment can be made to minimize a weighted average of the deviations, such as, $$d_e^2 + w_1 d_{s1}^2 + w_2 d_{s2}^2, \text{ or}$$

$$d_e^2 + w_1 (d_{s1} - d_e)^2 + w_2 (d_{s2} - d_e)^2.$$

Note that by minimizing these weighted averages instead of $d_e^2$, rippling is reduced.

Refinement

Figure 10:
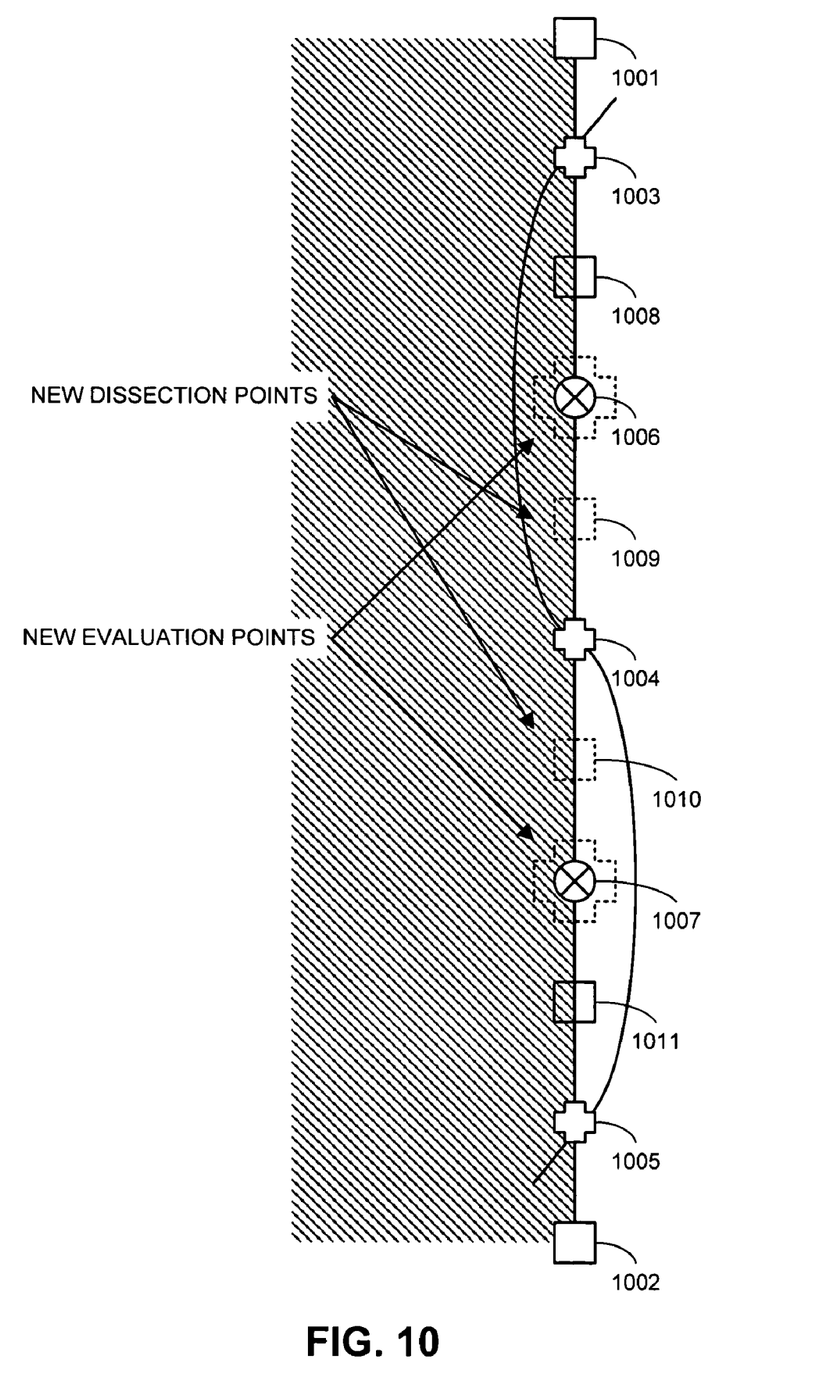
FIG. 10 illustrates a refinement operation in accordance with an embodiment of the invention.

FIG. 10 illustrates a refinement operation in accordance with an embodiment of the invention. In this example, a dissection defined by dissection points 1001, 1002, 1008 and 1011 includes evaluation points 1003–1005 and supplemental evaluation points 1006–1007. During the refinement operation; the segment from 1008 to 1011 is subdivided into multiple sub-segments by introducing additional dissection points 1009 and 1010. In this example, supplemental evaluation points 1006–1007 are converted into evaluation points for corresponding sub-segments. The system can also select, or create, additional supplemental evaluation points (not shown) for the newly created segments, i.e. 1008 to 1009, 1009 to 1010, and 1010 to 1011.

Regeneration

Figure 11:
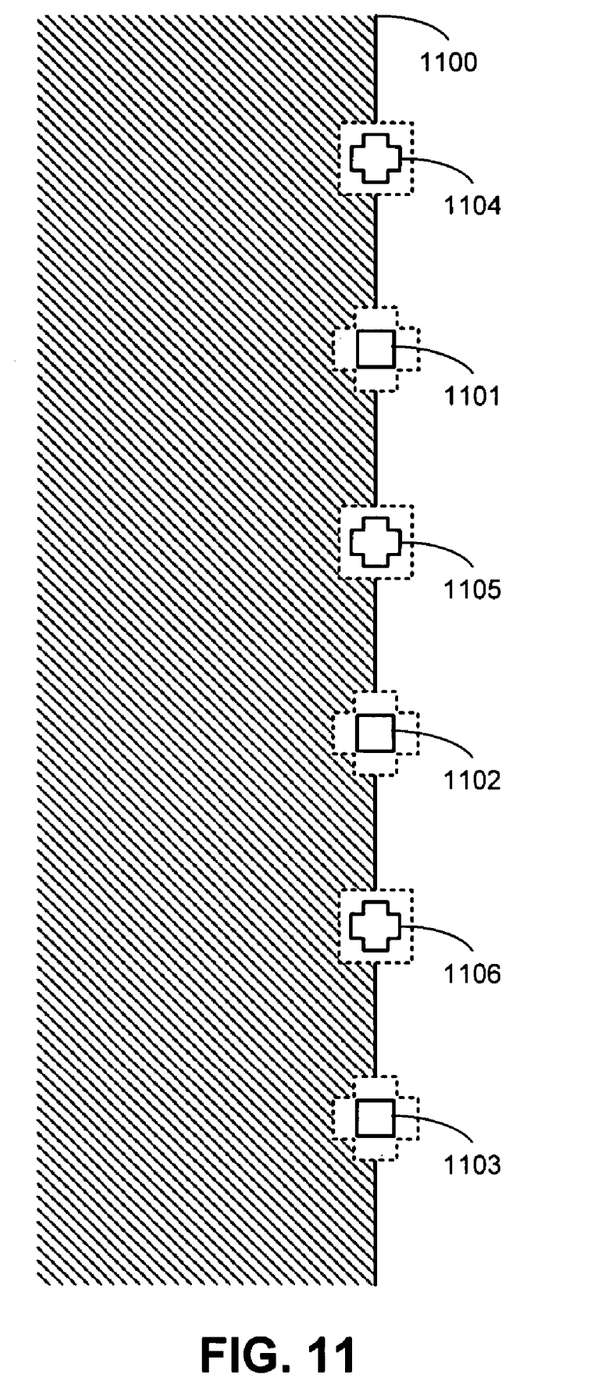
FIG. 11 illustrates a regeneration operation in accordance with an embodiment of the invention.

FIG. 11 illustrates a regeneration operation in accordance with an embodiment of the invention. In this example, an edge 1100 is initially associated with dissection points 1101–1103 and evaluation points 1104–1106. Edge 1100 is regenerated by swapping the dissection points 1101–1103 and the evaluation points 1104–1106, shown as dashed symbols on the figure. This regeneration may result in a better optical proximity correction, with less rippling effect. Note that in occasions where the regeneration results in worse rippling effect, this regeneration is undone and the regeneration is considered failed. Hence, ripple-controlled biasing (step 732 in FIG. 7) must be performed on the original dissection.

In the example illustrated in FIG. 11, dissection points 1101–1103 are converted into evaluation points and evaluation points 1104–1106 are converted into dissection points. However, in general, any modification of the dissection points 1101–1103 and the evaluation points 1104–1106 can be performed during a regeneration of edge 1100. The regeneration is can be based on the current ripple measurement information so as to minimize rippling effect for the regenerated segments.

The foregoing description is presented to enable one to make and use the invention, and is provided in the context of a particular application and its requirements. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Note that the present invention can be applied to any type of lithographic process for fabricating semiconductor chips, including processes that make use of, deep-ultraviolet (DUV) radiation, extreme ultraviolet (EUV) radiation, X-rays, and electron beams, along with suitably modified masks.

The foregoing descriptions of embodiments of the invention have been presented for purposes of illustration and description only. They are not intended to be exhaustive or to limit the invention to the forms disclosed. Accordingly, many modifications and variations will be apparent. Additionally, the above disclosure is not intended to limit the invention. The scope of the invention is defined by the appended claims.

What is claimed is:

1. A method for controlling rippling caused by optical proximity correction during an optical lithography process used in manufacturing an integrated circuit, comprising:
   selecting a first evaluation point for a given segment that is part of an edge in a layout of the integrated circuit;
   selecting a second evaluation point for the given segment;
   computing a first deviation from a target location for the given segment at the first evaluation point;
   computing a second deviation for the given segment at the second evaluation point; and
   controlling rippling for the given segment, if necessary, based upon a measurement of rippling computed from multiple deviations at multiple evaluation points, including the first deviation at the first evaluation point and the second deviation at the second evaluation point, wherein controlling rippling involves breaking the given segments into multiple segments in order to control ripple.

2. The method of claim 1, wherein the second evaluation point is a supplemental evaluation point.

3. The method of claim 1, wherein both the first evaluation point and the second evaluation point are located on the given segment.

4. The method of claim 1, wherein the first evaluation point is located on the given segment and the second evaluation point is located on an adjacent segment.

5. The method of claim 1, further comprising adjusting the bias, if necessary, for each segment that is part of the layout of the integrated circuit.

6. The method of claim 1, further comprising:
   selecting a third evaluation point for the given segment; and
   computing a third deviation for the given segment at the third evaluation point;
   wherein adjusting the bias for the given segment involves considering the third deviation at the third evaluation point.

7. The method of claim 1, wherein computing the first deviation involves using a model-based technique for computing the first deviation.

8. A computer-readable storage medium storing instructions that when executed by a computer cause the computer to perform a method for controlling rippling caused by optical proximity correction during an optical lithography process used in manufacturing an integrated circuit, the method comprising:
   selecting a first evaluation point for a given segment that is part of an edge in a layout of the integrated circuit;
   selecting a second evaluation point for the given segment;
   computing a first deviation from a target location for the given segment at the first evaluation point;
   computing a second deviation for the given segment at the second evaluation point; and
   controlling rippling for the given segment, if necessary, based upon a measurement of rippling computed from multiple deviations at multiple evaluation points, including the first deviation at the first evaluation point and the second deviation at the second evaluation point, wherein controlling rippling involves breaking the given segments into multiple segments in order to control ripple.

9. The computer-readable storage medium of claim 8, wherein the second evaluation point is a supplemental evaluation point.

10. The computer-readable storage medium of claim 8, wherein both the first evaluation point and the second evaluation point are located on the given segment.

11. The computer-readable storage medium of claim 8, wherein the first evaluation point is located on the given segment and the second evaluation point is located on an adjacent segment.

12. The computer-readable storage medium of claim 8, wherein the method further comprises adjusting the bias, if necessary, for each segment that is part of the layout of the integrated circuit.

13. The computer-readable storage medium of claim 8, wherein the method further comprises:
   selecting a third evaluation point for the given segment; and
   computing a third deviation for the given segment at the third evaluation point;
   wherein adjusting the bias for the given segment involves considering the third deviation at the third evaluation point.

14. The computer-readable storage medium of claim 8, wherein computing the first deviation involves using a model-based technique for computing the first deviation.

15. An apparatus for controlling rippling caused by optical proximity correction during an optical lithography process used in manufacturing an integrated circuit, comprising:
   a selection mechanism that is configured to,
      select a first evaluation point for a given segment that is part of an edge in a layout of the integrated circuit, and to
      select a second, evaluation point for the given segment;
   a deviation computing mechanism that is configured to,
      compute a first deviation from a target location for the given segment at the first evaluation point, and to
      compute a second deviation for the given segment at the second evaluation point; and
   a ripple controlling mechanism that is configured to control ripple for the given segment, if necessary, based upon a measurement of rippling computed from multiple deviations at multiple evaluation points, including the first deviation at the first evaluation point and the second deviation at the second evaluation point, wherein controlling rippling involves breaking the given segments into multiple segments in order to control ripple.

16. The apparatus of claim 15, wherein the second evaluation point is a supplemental evaluation point.

17. The apparatus of claim 15, wherein both the first evaluation point and the second evaluation point are located on the given segment.

18. The apparatus of claim 15, wherein the first evaluation point is located on the given segment and the second evaluation point is located on an adjacent segment.

19. The apparatus of claim 15, wherein the bias adjustment mechanism is configured to adjust the bias, if necessary, for each segment that is part of the layout of the integrated circuit.

20. The apparatus of claim 15,
wherein the selection mechanism is additionally configured to select a third evaluation point for the given segment; and
wherein the deviation computing mechanism is additionally configured to compute a third deviation for the given segment at the third evaluation point;
wherein the bias adjustment mechanism is configured to consider the third deviation at the third evaluation point in adjusting the bias for the given segment involves.

21. The apparatus of claim 15, wherein the deviation computing mechanism is configured to compute use a model-based technique in computing the first deviation.

22. A mask to be used in an optical lithography process for manufacturing an integrated circuit, wherein the mask is created through a process that controls rippling caused by optical proximity correction, the process comprising:
selecting a first evaluation point for a given segment that is part of an edge in a layout of the integrated circuit;
selecting a second evaluation point for the given segment;
computing a first deviation from a target location for the given segment at the first evaluation point;
computing a second deviation for the given segment at the second evaluation point; and
controlling rippling for the given segment, if necessary, based upon a measurement of rippling computed from multiple deviations at multiple evaluation points, including the first deviation at the first evaluation point and the second deviation at the second evaluation point, wherein controlling rippling involves breaking the given segments into multiple segments in order to control ripple.

23. An integrated circuit created through an optical lithography process using a mask, wherein the mask is created through a process that controls rippling caused by optical proximity correction, the process comprising:
selecting a first evaluation point for a given segment that is part of an edge in a layout of the integrated circuit;
selecting a second evaluation point for the given segment;
computing a first deviation from a target location for the given segment at the first evaluation point;
computing a second deviation for the given segment at the second evaluation point; and
controlling rippling for the given segment, if necessary, based upon a measurement of rippling computed from multiple deviations at multiple evaluation points, including the first deviation at the first evaluation point and the second deviation at the second evaluation point, wherein controlling rippling involves breaking the given segments into multiple segments in order to control ripple.

24. A means for controlling rippling caused by optical proximity correction during an optical lithography process used in manufacturing an integrated circuit, comprising:
a selection means for,
selecting a first evaluation point for a given segment that is part of an edge in a layout of the integrated circuit, and for
selecting a second evaluation point for the given segment;
a deviation computing means for,
computing a first deviation from a target location for the given segment at the first evaluation point, and for
computing a second deviation for the given segment at the second evaluation point; and
a ripple controlling means for controlling ripple for the given segment, if necessary, based upon a measurement of rippling computed from multiple deviations at multiple evaluation points, including the first deviation at the first evaluation point and the second deviation at the second evaluation point, wherein controlling rippling involves breaking the given segments into multiple segments in order to control ripple.

* * * * *